United States Patent [19]

Housako et al.

[11] Patent Number: 5,682,390
[45] Date of Patent: Oct. 28, 1997

[54] PATTERN GENERATOR IN SEMICONDUCTOR TEST SYSTEM

[75] Inventors: Takahiro Housako, Gyoda; Jun Hashimoto, Sohka, both of Japan

[73] Assignee: Advantest Corporation, Tokyo, Japan

[21] Appl. No.: 518,560

[22] Filed: Aug. 23, 1995

[30] Foreign Application Priority Data

Jun. 19, 1995 [JP] Japan .................................. 7-175532

[51] Int. Cl.⁶ .................................................... G11C 29/00
[52] U.S. Cl. .......................... 371/21.3; 371/21.1; 371/27
[58] Field of Search ............... 371/21.3, 21.1, 371/27, 25.1, 22.1; 365/201, 200

[56] References Cited

U.S. PATENT DOCUMENTS

| | | | |
|---|---|---|---|
| 4,293,950 | 10/1981 | Shimizu et al. | 371/21 |
| 4,497,056 | 1/1985 | Sugamori | 371/25 |
| 4,631,724 | 12/1986 | Shimizu | 371/21 |
| 4,972,418 | 11/1990 | Chou | 371/21.2 |
| 5,412,662 | 5/1995 | Honma et al. | 371/21.1 |

*Primary Examiner*—Phung Chung
*Attorney, Agent, or Firm*—Knobbe, Matens, Olson & Bear, LLP

[57] ABSTRACT

A semiconductor test system is to realize a pattern generation that makes possible to test memory devices having arbitrary cycle latency operations when using multiple pattern generators. A cycle shift circuit that outputs a delayed expected value signal by shifting the expected value by one cycle with the operating period of the pattern generator is arranged. A N to 1 selector that selects an arbitrary signal from the expected value signal output by the multiple pattern generators including itself and the delayed expected value signal output by the multiple pattern generators excluding itself is arranged. A cycle shift section is arranged for the output selected by the selector. An arbitrary cycle shift can be generated by the expected value pattern using the above multiple pattern generators. In further aspect, a semiconductor test system includes a pattern generator having a pattern generation section that generates the driver pattern and expected value signal and a cycle shift section that shifts the expected value signal, a waveform shaper that outputs the driver waveform to the memory using a clock signal, and multiple phase converters that generate the expected value pattern by shifting the expected value shift signal with an operating cycle of the memory generated by a period generator, a phase converter, and a timing generator having a timing shift section that generates a strobe signal shifted by the number of cycles by the latency operations, a logical comparator that compares the cycle delayed output data generated from the memory with the expected value pattern at the timing of the strobe signal.

2 Claims, 13 Drawing Sheets

PATTERN GENERATOR IN SEMICONDUCTOR TEST SYSTEM

FIELD OF THE INVENTION

This invention relates to a pattern generator in a semiconductor test system for testing semiconductor devices, and more particularly, to a pattern generator which makes possible to test a memory device having latency cycles when reading out data therefrom.

BACKGROUND OF THE INVENTION

FIG. 9 illustrates a fundamental configuration of a conventional memory test system. In a pattern generator 20, a pattern generation section 22 generates a driver pattern consisting of an address signal, test data signal and control signal to be applied to a memory 10 to be tested based on a predetermined algorithm. The pattern generation section 22 also generates an expected value signal. A cycle shift section 21 delays the expected value signal by the preset number of cycles to compare with the output from the memory 10. A waveform shaper 12 generates a driver waveform using the driver pattern from the pattern generator 20 and a clock signal from a timing generator 11 based on a predetermined waveform mode and impresses to the memory 10 to be tested. The memory 10 outputs data which is resulted from the applied driver waveform. The output data is compared with the expected value data pattern from the pattern generator 20 at a timing of a strobe from the timing generator 11 at a logical comparator 13 to determined whether the memory 10 under test is acceptable or not by the comparison results.

FIG. 10 illustrates an example of test operation timing diagram of a high speed memory device having 2 cycle latency on its output. Note that the latency operation is an operation of outputting read data with a delay of certain cycles from the input cycle of the address during the read operation in a semiconductor memory which performs high speed read/write operations in synchronism with an external clock. The number of cycles delayed in reading the data from a memory is determined by a type of memory to be tested and frequencies of the external clock.

The driver pattern is shaped by the clock (CLOCK), and the memory 10 to be tested is driven by the driver waveform. The memory 10 having 2 cycle latency operation outputs data with a delay of 2 cycles from the timing of the driver waveform. While the expected value signal is delayed by 2 cycles at the cycle shift section 21 and output to the logical comparator 13 as the expected value pattern. The logical comparator 13 compares the output data with the expected value pattern using the strobe signal (STRB) timing and determines whether or not it should be accepted.

When the operating frequency of the pattern generator 20 is lower than that of the memory 10, it corresponds to the operating frequency of the device by having multiple pattern generators as shown in FIG. 11. For example, when testing the memory 10 with the operating frequency M using the pattern generator 20 with the operating frequency L, use N pattern generators 20 where M≦N×L when M>L.

N pattern generators 20 process the driver pattern and expected value pattern from 1 through n steps in parallel and provide each driver pattern to the waveform shaper 112 and each expected value pattern to the logical comparator 113. The waveform shaper 112 composes the driver waveform with a frequency of M by each driver pattern and stepped CLOCK corresponding to each driver pattern, and impresses to the memory 10 to be tested. The logical comparator 113 determines the acceptance of each expected value pattern and output data corresponding to each expected value pattern at a frequency of M by the STRB.

FIG. 12 is a general case where there is no latency operation, and shows an operating timing diagram when N pattern generators 20 are used. In this case, the memory 10 performs n cycle operations in contrast to one cycle of the pattern generator 20. The driver pattern is output to the waveform shaper 112 at a cycle of the pattern generator 20 from each pattern generator 20 1 through n. The CLOCK output from the timing generator 11 selects the driver pattern input to the waveform shaper 112 at the operating frequency of the memory 10. Whereas the expected value pattern is output to the logical comparator 113 from each pattern generator 20 1 through N at the cycle of the pattern generator 20. The STRB output from the timing generator 11 compares the output data from the memory 10 with the expected value pattern at the operating frequency of the memory 10 and determines its acceptance.

FIG. 13 illustrates a timing diagram when testing using N pattern generators 20 and one cycle is shifted at the cycle shift section 21 of each pattern generator 20. In this case, the memory 10 operates at n cycles in contrast to one cycle of the pattern generator 20. The driver pattern is output to the waveform shaper 112 at the cycle of the pattern generator 20 from each pattern generator 20 1 through N. Whereas the expected value signal output from the pattern generation section 22 is output to the cycle shift section 21 at the cycle of the pattern generator 20 from each pattern generation section 22 from the pattern generator 1 through N. When 1 is set in the cycle shift section 21, the expected value pattern generated from the pattern generator 20 is shifted by n cycles at the cycle of the memory 10.

Hence, when using N pattern generators 20, the value set in the cycle shift section 21 becomes N times the setting value at the cycle of the memory 10 and the cycle delay can be set to only a multiple of N. That is, when N pattern generators are required where the relationship between the operating frequency M of the memory 10 and the operating frequency L of the pattern generator 20 is M>L and M≦N× L, the expected value pattern of the memory 10 with a cycle delay of the output data whose value is other than a multiple of N can not be generated.

In FIG. 13, during D1 to Dn−1, as the expected value pattern is indeterminate and it is compared at Dn using the expected value pattern E1 at D1, the cycles of the expected value pattern and the timing of the output data are not matched.

SUMMARY OF THE INVENTION

The objective of this invention is to realize a semiconductor test system that make possible to test memory devices having arbitrary cycle latency operations when testing using multiple pattern generators.

In accordance with the first embodiment of this invention, in order to achieve the above objective, the pattern generation section that outputs the driver pattern and expected value pattern in the pattern generator of this invention is arranged. The cycle shift circuit that outputs a delayed expected value signal by shifting the expected value by one cycle with the operating period of the pattern generator is arranged. In addition, the N to 1 selector that selects an arbitrary signal from the expected value signal output by the multiple pattern generators including itself and the delayed expected value signal output by the multiple pattern generator excluding itself is arranged. The cycle shift section that outputs the expected value pattern by delaying the output signal selected with the N to 1 selector by the setting value at the operating period of the pattern generator is arranged.

In order to generate an arbitrary cycle shift by the expected value pattern, the above composed multiple pattern generators are used. The waveform shaper that inputs multiple driver patterns output from the pattern generators and outputs a driver waveform using the CLOCK signal of the operating period of the memory to be tested is arranged. In addition, the logical comparator that inputs the multiple expected value patterns output from the pattern generators and compares with the output data from the memory to be tested using the STRB signal of the operating period of the memory.

In the above composed pattern generator, when testing multiple pattern generators, the memory device having arbitrary cycle latency operations can be tested.

In accordance with the second embodiment of this invention, in order to achieve the above objective, the semiconductor test system of this invention is composed as follows:

That is, in the semiconductor test system comprising multiple pattern generators 20 consisting of the pattern generation section 22 that generates the driver pattern and expected value signal at the operating period of the pattern generator generated from a period generator 231 and a cycle shift section 21 that shifts the expected value signal at the operating cycle of the pattern generator, a waveform shaper 212 that outputs the driver waveform to the memory 10 using a clock signal of the operating cycle of the memory to be tested generated from a timing generator 211 is arranged, and multiple phase converters 232 that generate the expected value pattern by shifting the above expected value shift signal with the RATE signal of the operating cycle of the memory generated from the period generator 231 is arranged, and multiple timing generators 211 consisting of a timing generation section 233 that generates a shifted STRB signal by the operating period of the memory generated from the period generator 231 and a timing shift section 234 that generates the STRB signal shifted by the number of cycle delays within the range of the number of pattern generators N is arranged, the logical comparator 213 that compares the cycle delayed output data generated from the memory 10 with the expected value pattern output from the multiple phase converters 232 using the STRB signal output from the multiple timing generator 211 and determines its acceptance.

In the semiconductor test system as composed above, when testing using multiple pattern generators, it has an effect of making possible the device testing during the latency operation by cycle-shifting the expected value signal from the pattern generator and delaying the STRB signal from the timing generator for the memory device having arbitrary cycle latency operations when the operation frequency of the test system is lower than the operating frequency of the device to be tested.

DETAILED DESCRIPTION OF THE PREFERRED EMBODIMENTS

Figure 1:
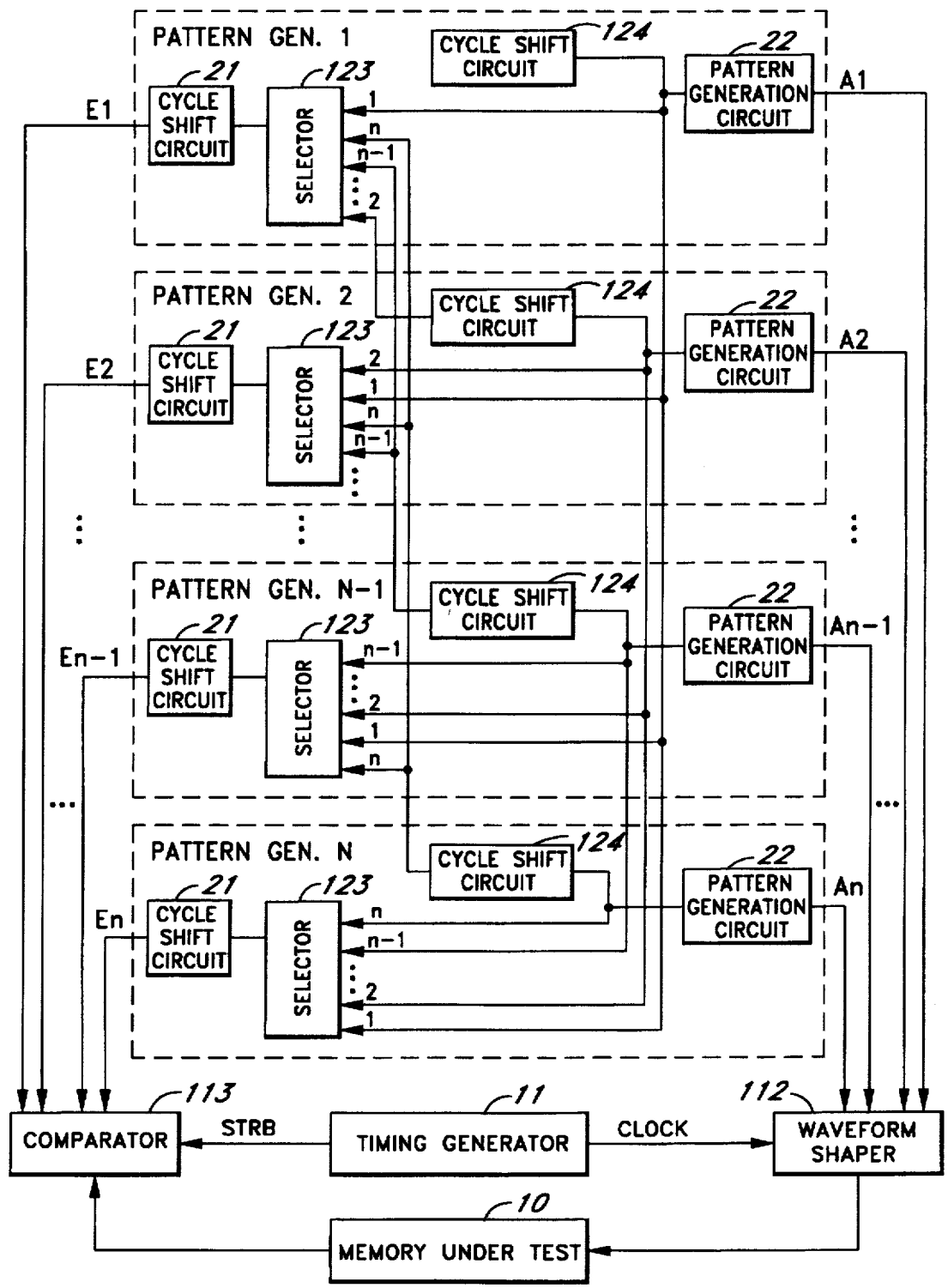
FIG. 1 is a circuit block diagram for testing a memory using multiple pattern generators in accordance with the first embodiment of this invention.

The first embodiment of this invention is explained by referring to the drawings.

Figure 2:
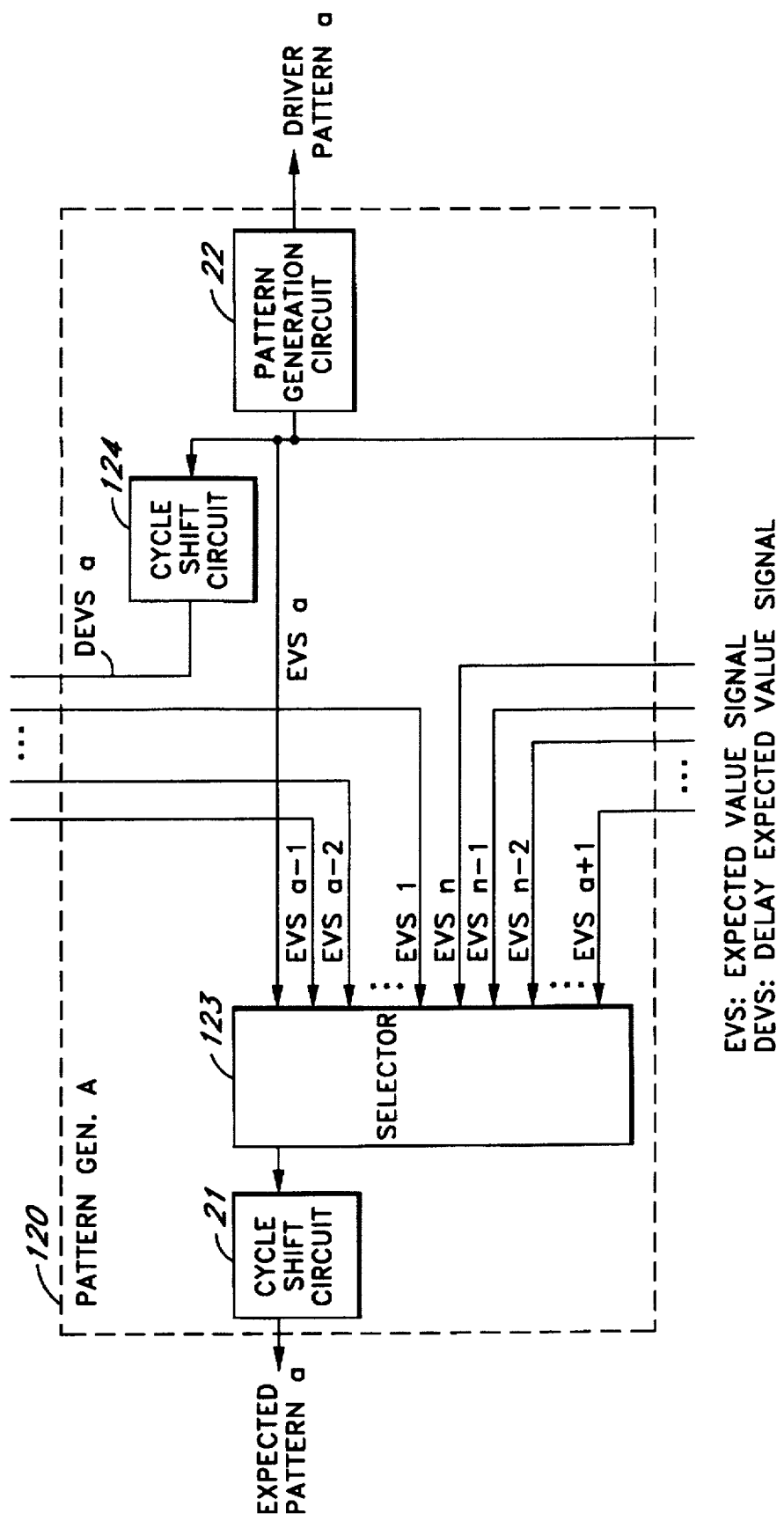
FIG. 2 shows a circuit block diagram of the A-th pattern generator 120 of the first embodiment by this invention.

FIG. 2 shows a block diagram of the A-th pattern generator 120 of the first embodiment by this invention. In this block diagram, the N to 1 selector 123 and one cycle fixed cycle shift circuit 124 are placed between the pattern generation section 22 and cycle shift section 21 in the conventional pattern generator 20. By this way, it makes possible to output the expected value signal from the pattern generation section 22 of the pattern generator 120 or the delayed expected value signal from the one cycle fixed cycle shift circuit 124 as the expected value pattern from all the pattern generator 120 through the N to 1 selector 123. At this instance, the one cycle fixed cycle shift circuit 124 delays the expected value signal from the pattern generation section 22 by one cycle and outputs as the delayed expected value signal.

FIG. 1 is a connection block diagram when N pattern generators 120 are connected. The N to 1 selector 123 selects the expected value signal output from the pattern generation section 22 of the (A−R)th pattern generator 120 for the A-th pattern generator 120 when R is smaller than N for the memory that performs R cycle latency operations. Note that when (A−R)≦0, it selects the delayed expected value signal output from the (A−R+N)th one cycle fixed shift circuit 124.

For example, when A=2 and R=1 in FIG. 1, that is, the N to 1 selector 123 of the pattern generator 1 selects the expected value signal output from the pattern generation section 22 of the first pattern generator 120 as A−R=1.

In addition, in FIG. 1, when A=1 and R=1 in FIG. 1, that is, the N to 1 selector 123 of the pattern generator 1 selects the delayed expected value signal output from the N-th one cycle fixed cycle shift circuit as A−R+N=N from A−R=0≦0.

When using N pattern generators 120 so that the relationship of the operating frequency M of the memory 10 and the operating frequency L of the pattern generator 120 becomes M>L and M≦N×L, and testing the memory 10 having the output data of R cycle delays, S, which is an integer of R+N, is set in the cycle shift section 21 of each pattern generator 120. Next, the residual of R+N is set in the N to 1 selector 123.

By this way, the N to 1 selector 123 of the A-th pattern generator 120 selects the (A−T)th of the expected value signal. Note that when (A−T)≦0, it selects the (A−T+N)th delayed expected value signal.

In the cycle shift section 21, the expected value pattern is generated in synchronizing with the cycle delay R of the output data of the memory 10 by cycle-shifting by the setting value S.

For example, when N=4 and R=5 in FIG. 1, it yields S=1 and T=1. A=2, that is, the N to 1 selector 123 of the second pattern generator 120 selects the A−T= first expected value signal. Furthermore, A=1, that is, , the N to 1 selector 123 of the first pattern generator 120 selects the (A−T+N)=N=4 th delayed expected value signal as A−T=0≦0. In addition, as S=1, one cycle of the pattern generator 120 is unconditionally cycle-delayed by N=4.

Figure 3:
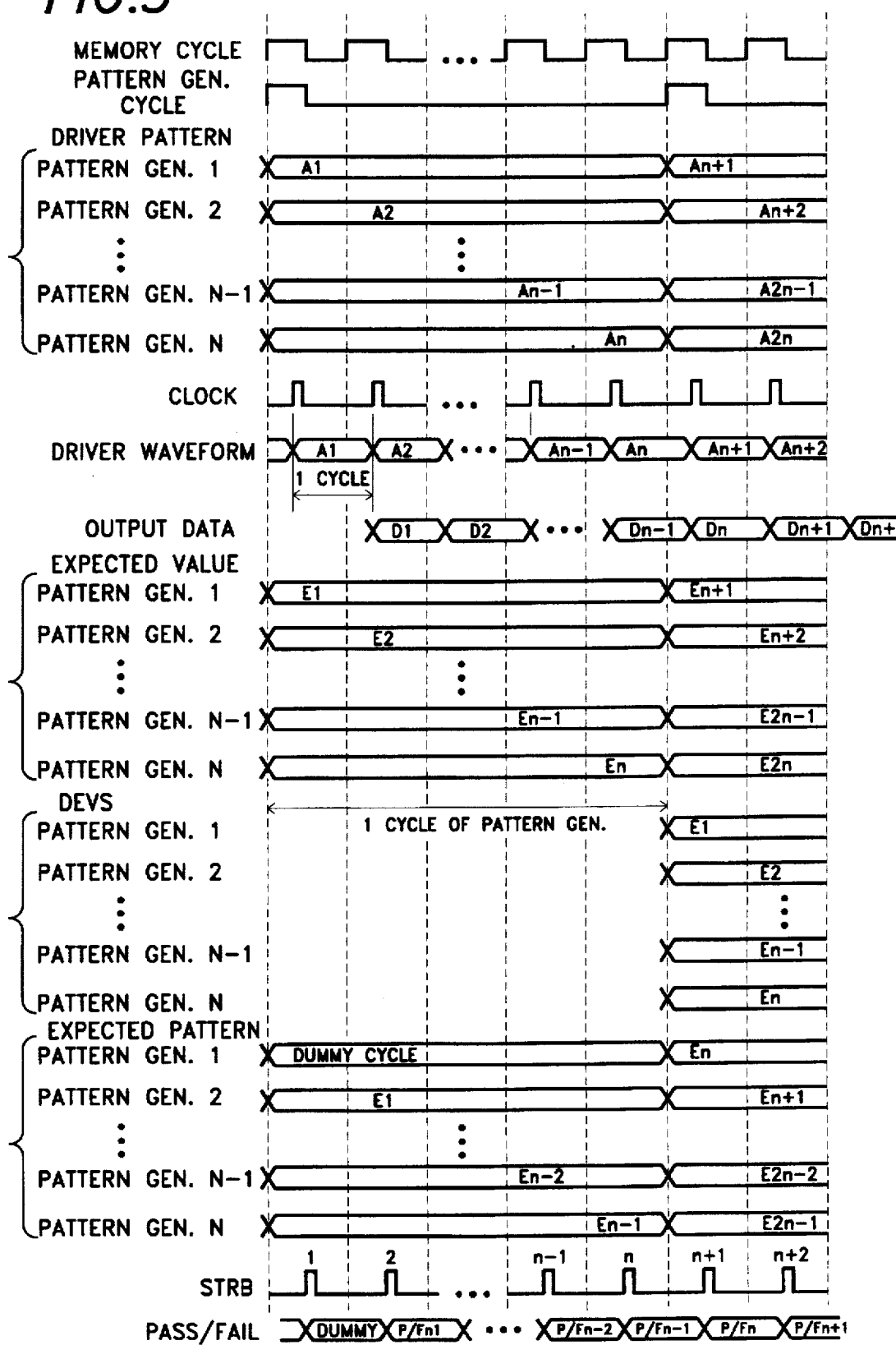
FIG. 3 illustrates a timing diagram for testing a memory using multiple pattern generators in accordance with the first embodiment of this invention.

FIG. 3 illustrates a timing diagram for the cycle delay of 1 when testing using N pattern generators 120. In this case, the memory 10 performs n cycle operations for 1 cycle of the pattern generator 120. The driver patterns are output from the pattern generator 120 1 through N to the waveform shaper 112 at a cycle of the pattern generator 120. The CLOCK output from the timing generator 11 selects the driver pattern input to the waveform shaper 112 at the operating period of the memory 10 and supplies the driver waveform to the memory 10. While the expected value signal output from the pattern generation section 22 is output to the N to 1 selector 123 and one cycle fixed cycle shift circuit 124 at the cycle of the pattern generator 120 from each pattern generation section 11 from the pattern generator 1 through N. The delayed expected value signal generated from the one cycle fixed cycle shift circuit 124 is shifted by n cycles at the cycle of the memory 10 and is output. The N to 1 selector 123 selects one signal from the expected value signal from the pattern generation section 22 and the delayed expected value signal from the one cycle fixed cycle shift circuit 124 and outputs to the logical comparator 113 as the expected value pattern at the cycle of the pattern generator 120 through the cycle shift section 21. The STRB from the timing generator 1 compares the output data from the memory 10 with the expected value pattern, and determines its acceptance.

As the first embodiment of this invention is composed as explained above, even when testing using multiple pattern generators, it is possible to test memory devices having arbitrary cycle latency operations.

The second embodiment of this invention is explained by referring to the figures.

Figure 4:
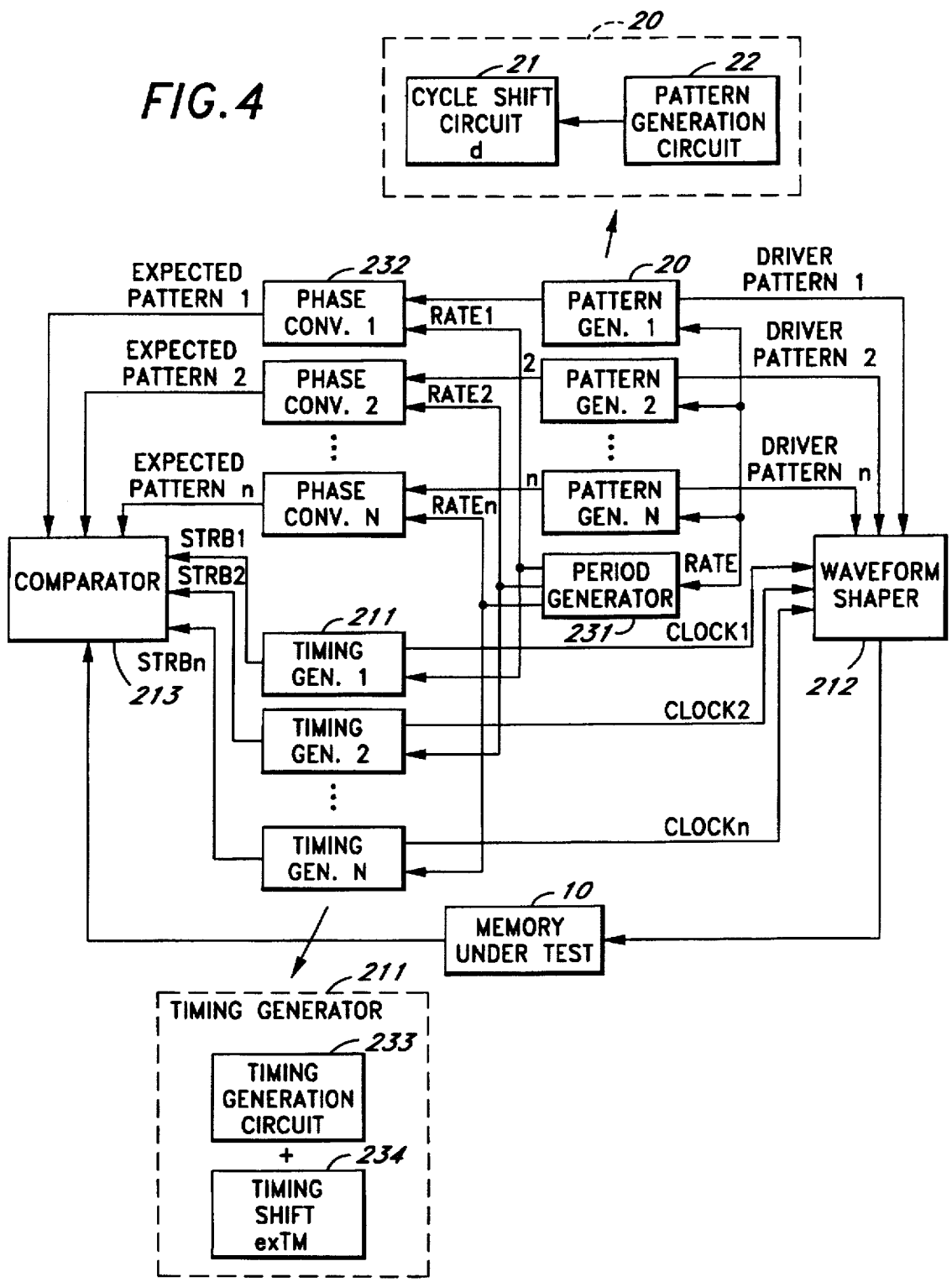
FIG. 4 is a circuit block diagram of the semiconductor test system in accordance with the second embodiment of this invention.

FIG. 4 is a block diagram of the second embodiment of this invention. This circuit is composed of multiple pattern generators 20 consisting of the pattern generation section 22 that generates the driver pattern and expected value signal at the operating period of the pattern generator generated from the period generator 231 and the cycle shift section 21 that shifts the expected value signal at the operating cycle of the pattern generator, the waveform shaper 212 that outputs the driver waveform to the memory 10 using a clock signal of the operating cycle of the memory generated from the timing generator 211 is arranged, and multiple phase converters 232 that generate the expected value pattern by shifting the above expected value shift signal with the RATE signal of the operating cycle of the memory generated from the period generator 231 is arranged, and multiple timing generators 211 consisting of the timing generation section 233 that generates a shifted STRB signal by the operating period of the memory generated from the period generator 231 and a timing shift section 234 that generates a STRB signal shifted by the number of cycle delays within the range of the number of pattern generators N is arranged, the logical comparator 213 that compares the cycle delayed output data generated from the memory 10 with the expected value pattern output from the multiple phase converters 232 using the STRB signal output from the multiple timing generator 211 and determines its acceptance.

When the relationship of the operating frequency L of the test system and pattern generator 20 and the operating frequency M of the memory is M>L, it requires M+L≦N pattern generators 20 and the timing generators 211 in order to determine the acceptance of the memory to be tested. The driver patterns generated by each pattern generator 20 are put through the waveform shaper 212 and applied to the memory 10 as the driver waveform. In addition, under the latency operation, the output data is generated with a cycle delay of D.

On the other hand, the expected value pattern performs D+N operations, and the expected value signal is output from the pattern generator 20 after being shifted in the cycle shift section 21 by the divided value d. The output expected value shift signals are shifted in synchronizing with the RATE signal from the period generator 231 and output as the expected value signal by the phase converter 232.

The STRB signals from each timing generator 211, which are applied to the logical comparator 213 are generated with a delay of exTM when the residual of the previous operation D+N is e and the period of the memory 10 is TM.

By this operation, the output data and each STRB signal exist at the same timing in the logical comparator 213, and as each STRB signal exists within the corresponding each expected value pattern, it can determine the acceptance for each expected value pattern.

Figure 5:
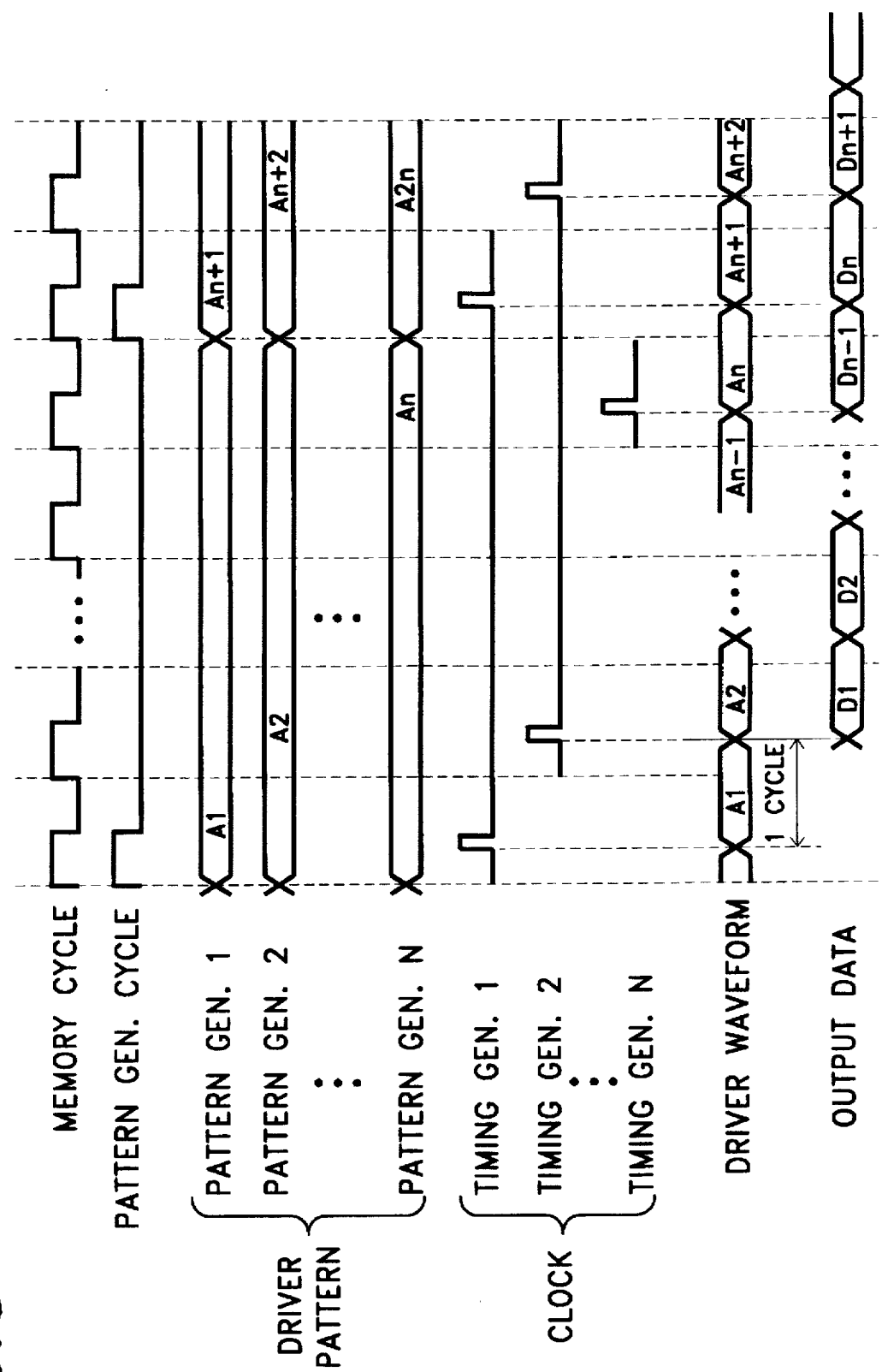
FIG. 5 illustrates a timing diagram when the cycle delay is 1 in accordance with the second embodiment of this invention.
Figure 6:
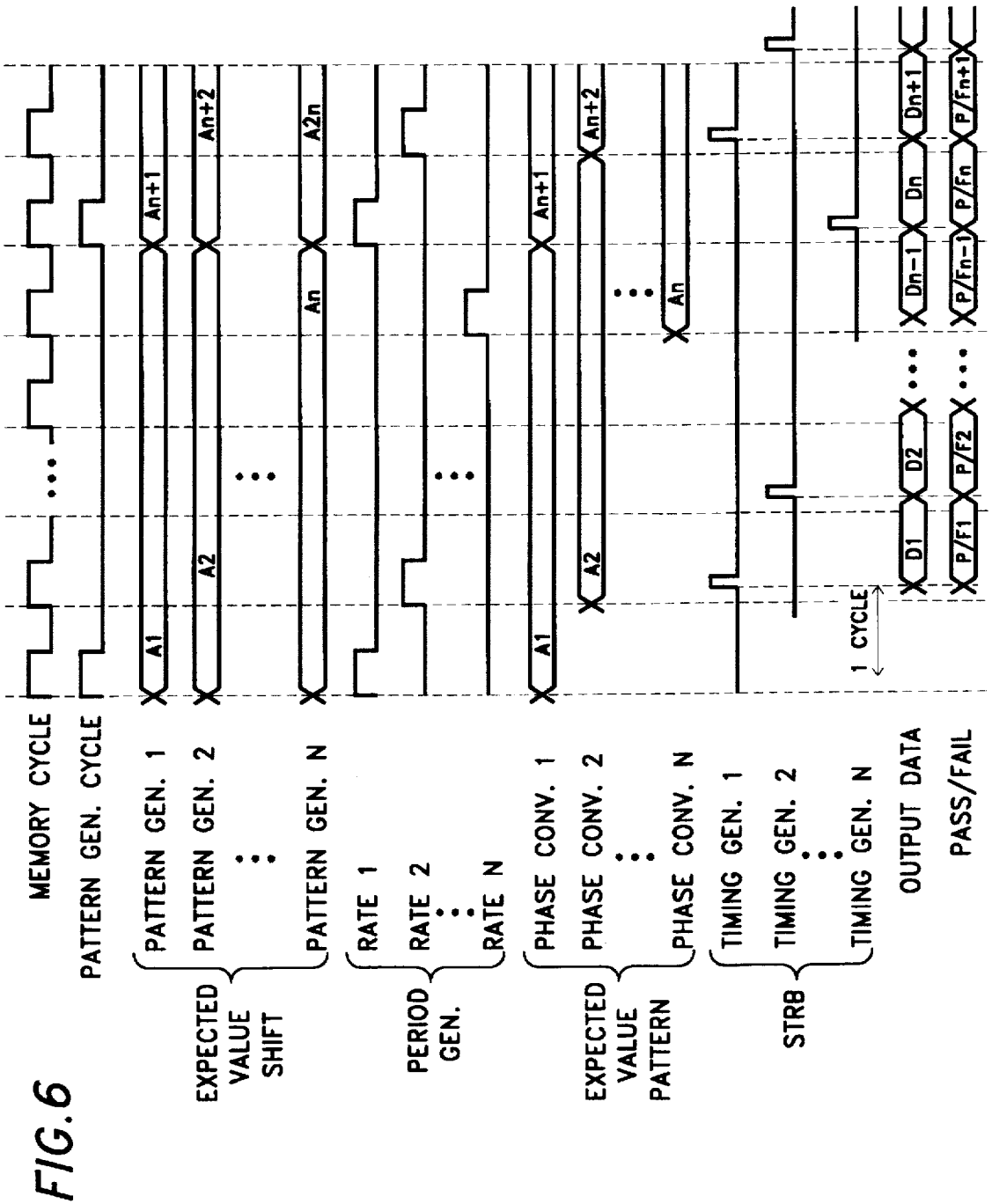
FIG. 6 illustrates a timing diagram when the cycle delay is 1 in accordance with the second embodiment of this invention.

FIGS. 5 and 6 illustrate timing diagrams when the cycle delay is 1 when testing using N pattern generators 20.

In this case, the driver patterns generated by each pattern generator 20 are put through the waveform shaper 212 and applied to the memory 10 as the driver waveform. In addition, under the latency operation, the output data is generated with a cycle delay of D. In this case, it is generated with a delay of one cycle.

On the other hand, the expected value pattern performs D+N operations, and the expected value signal is output from the pattern generator 20 after being shifted in the cycle shift section 21 by the divided value d. The output expected value shift signals are shifted in synchronizing with the RATE signal output from the period generator 231 and output as the expected value signal by the phase converter 232. In this case, as d=0, there is no shift on the expected value shift signal and it is shifted in synchronizing with the RATE signal and output as the expected value pattern signal.

The STRB Signals from each timing generator 211, which are applied to the logical comparator 213 are generated with a delay of exTM when the residual of the previous operation D+N is e and the period of the memory 10 is TM. In this case, as e=1, the STRB signal is generated with a delay of TM cycles.

By this operation, the output data and each STRB signal exist at the same timing in the logical comparator 213, and as each STRB signal exists within the corresponding each expected value pattern, it can determine the acceptance for each expected value pattern.

Figure 7:
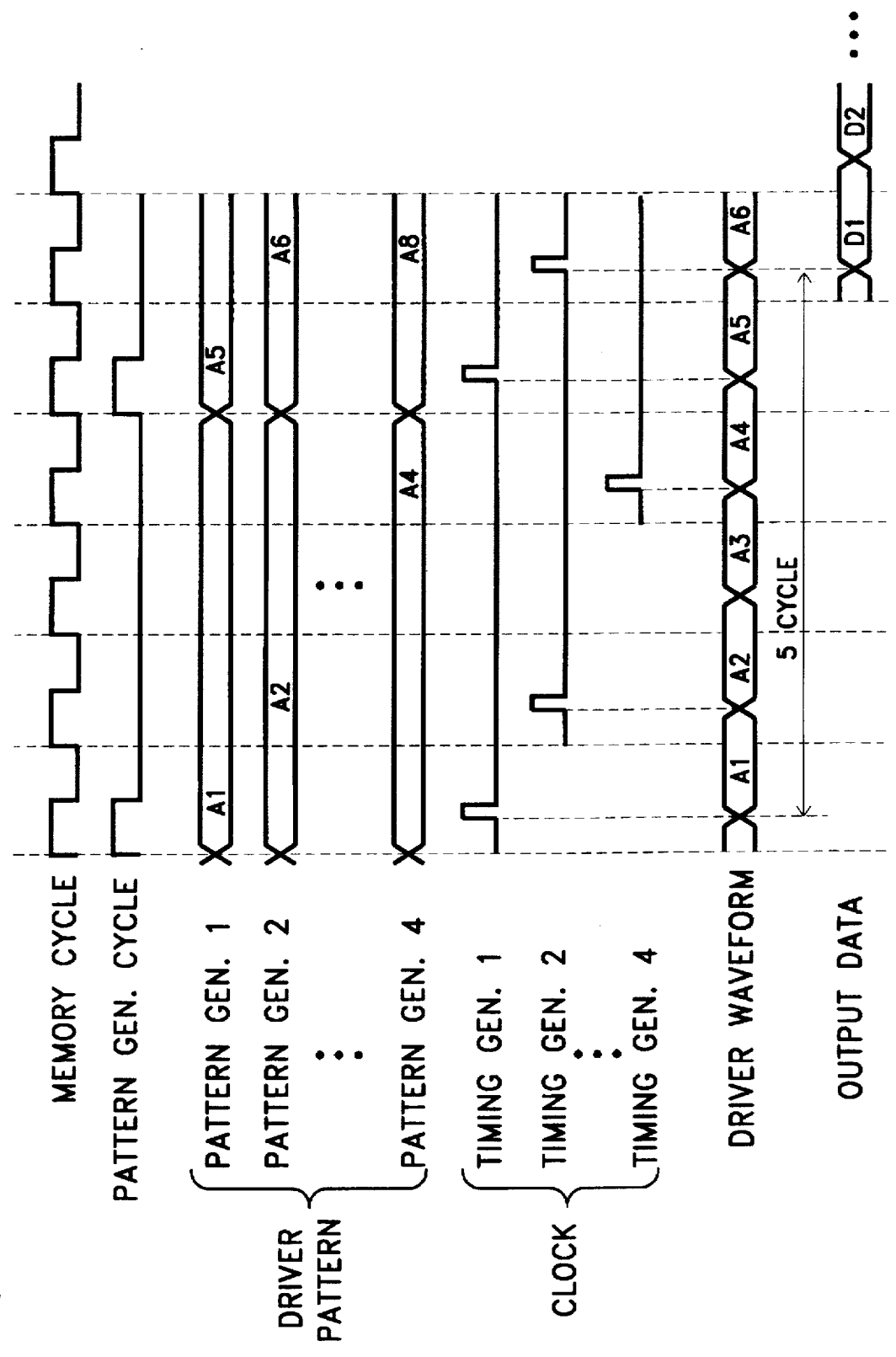
FIG. 7 illustrates a timing diagram when the cycle delay is 5 in accordance with the second embodiment of this invention.
Figure 8:
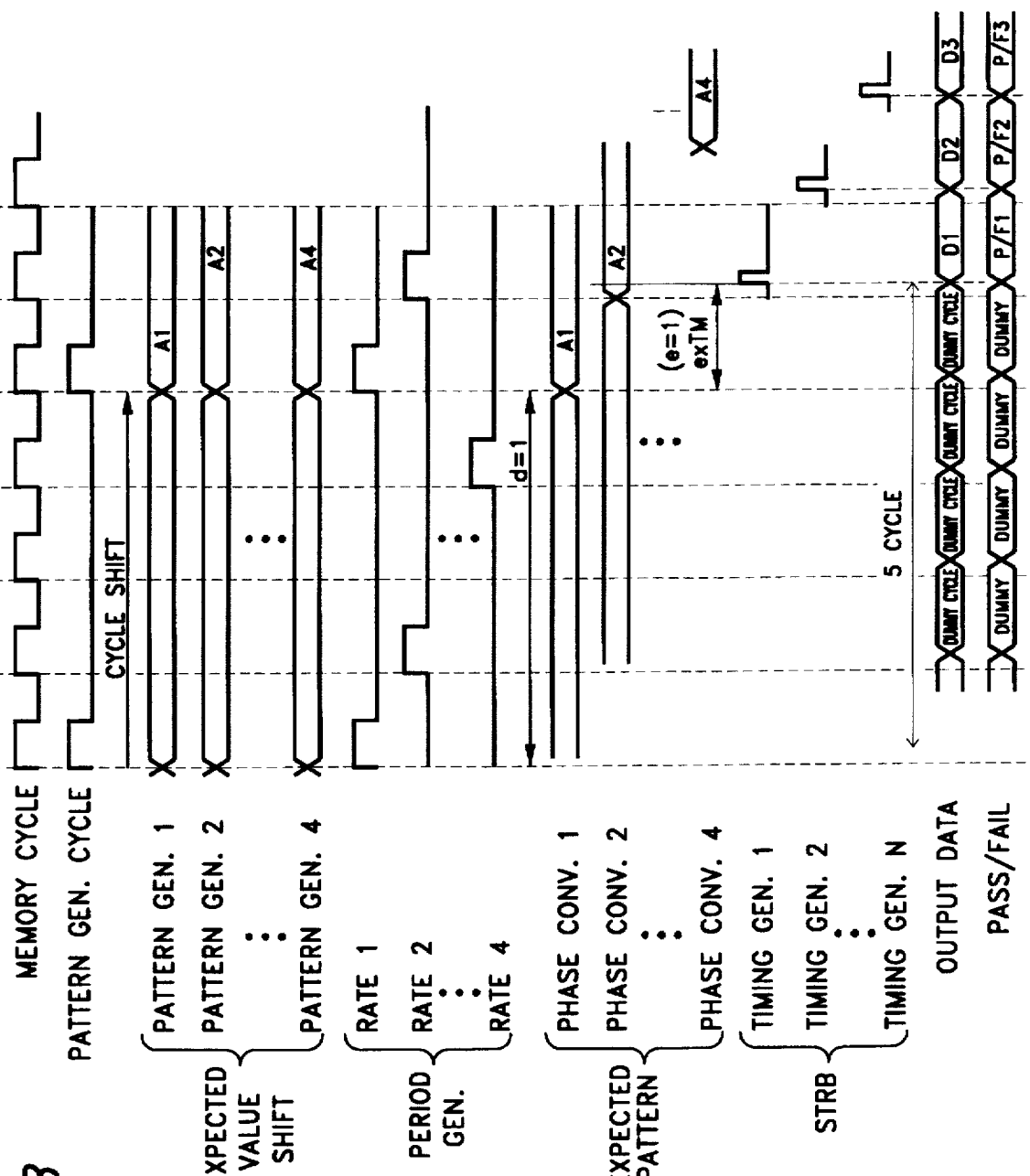
FIG. 8 illustrates a timing diagram when the cycle delay is 5 in accordance with the second embodiment of this invention.
Figure 9:
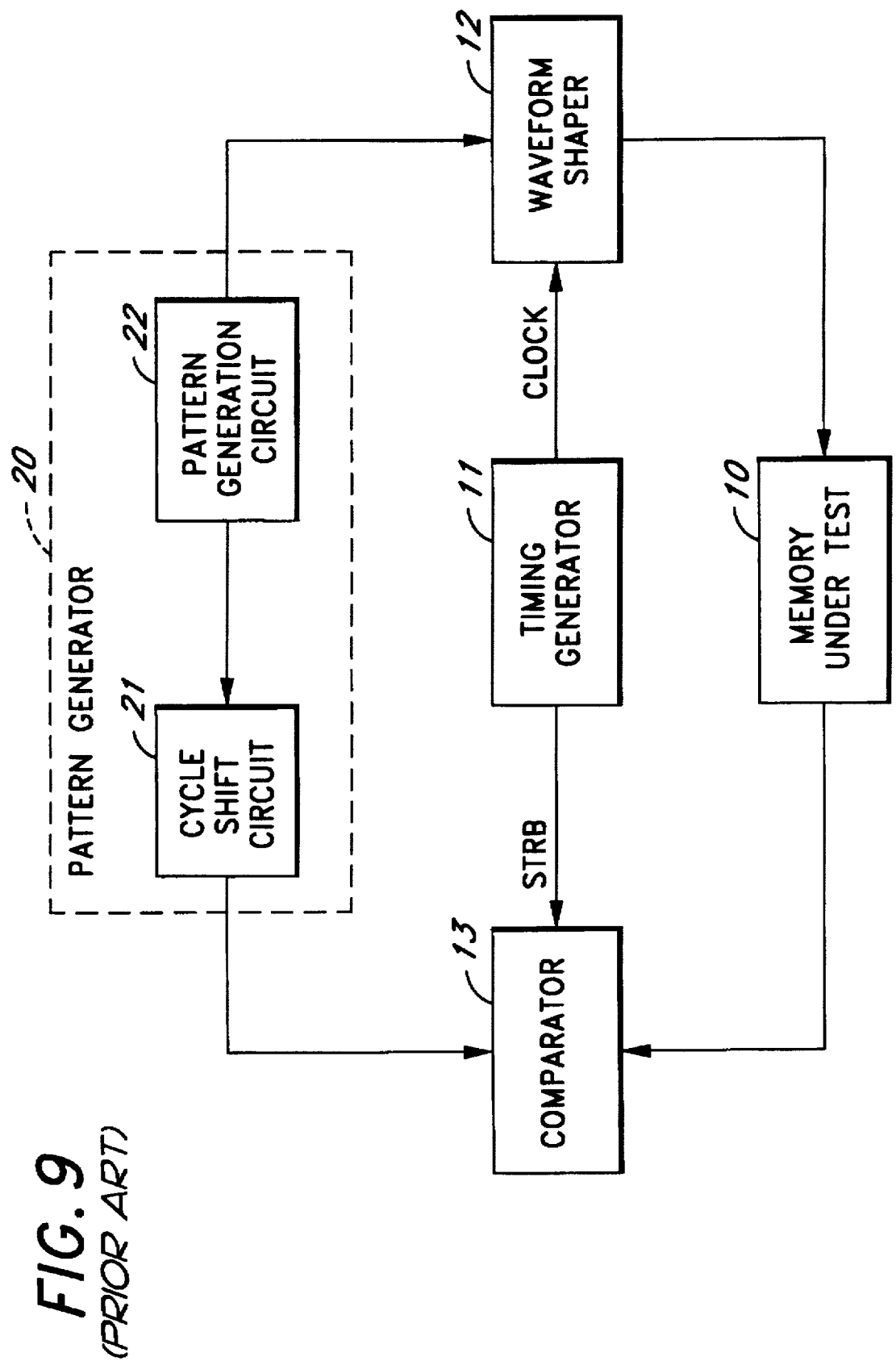
FIG. 9 illustrates a basic block diagram of conventional memory test systems.
Figure 10:
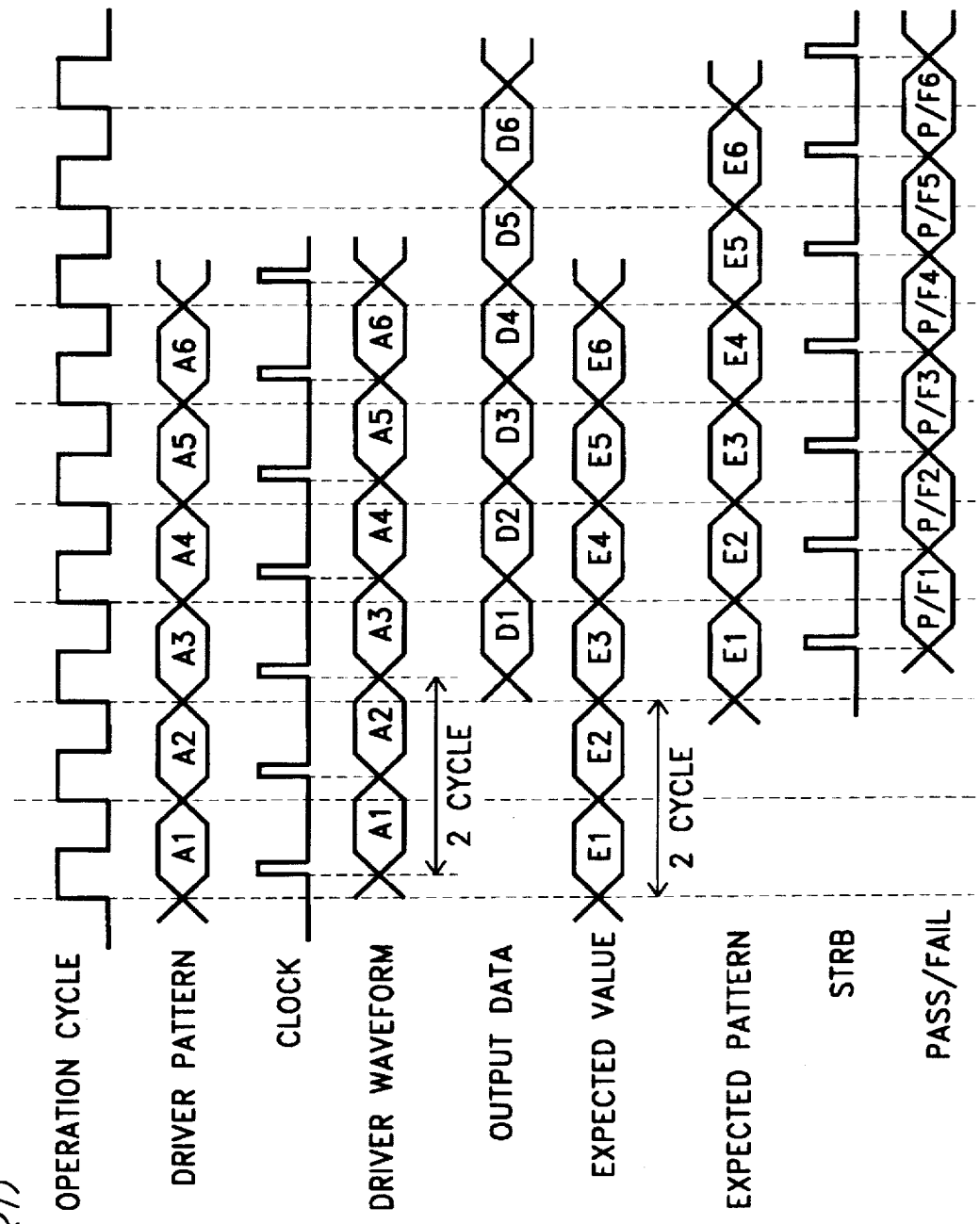
FIG. 10 illustrates a test operation timing diagram of a memory device having latency operations when one conventional pattern generator is used.
Figure 11:
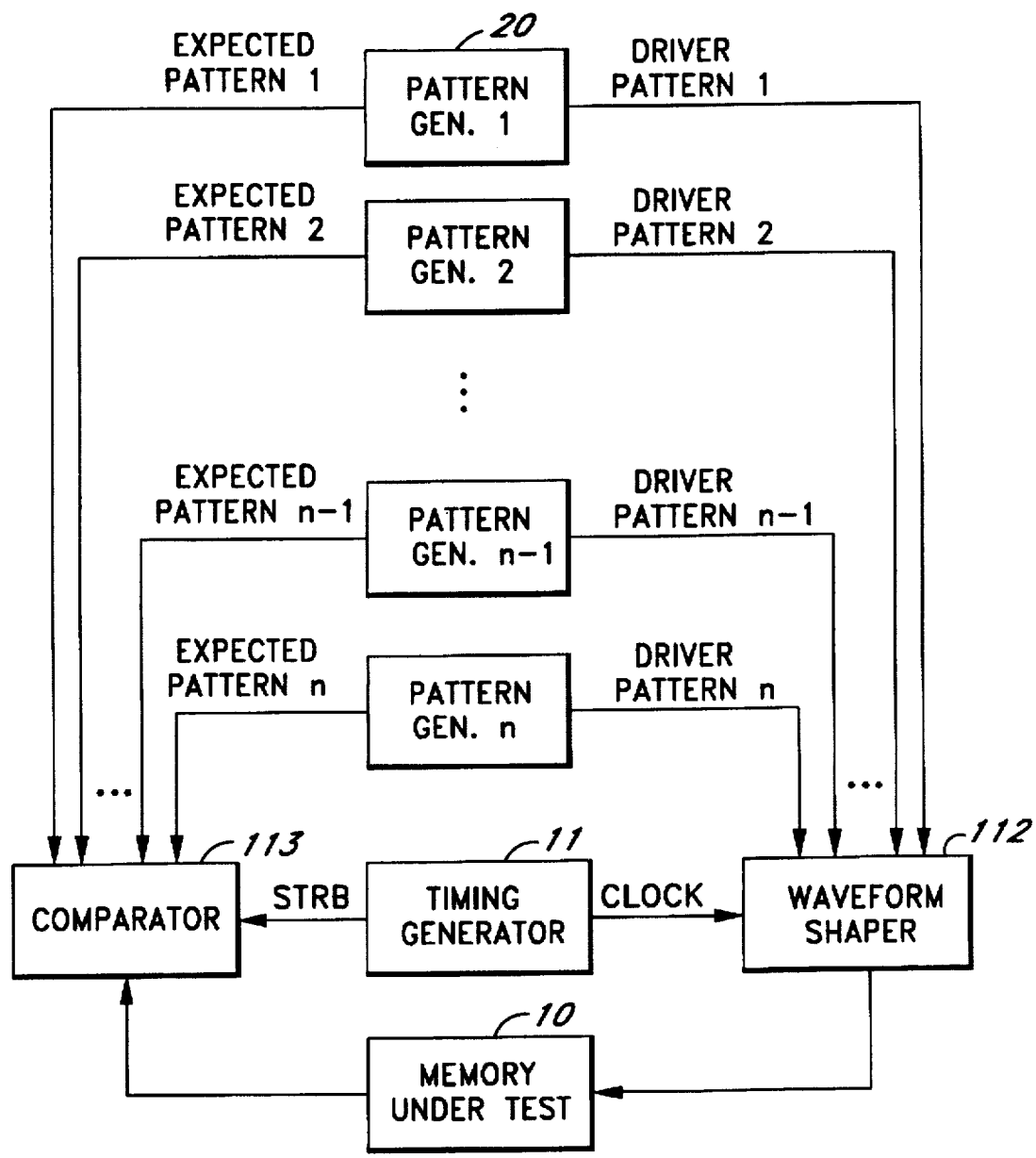
FIG. 11 is a circuit block diagram for testing a memory using conventional multiple pattern generators.
Figure 12:
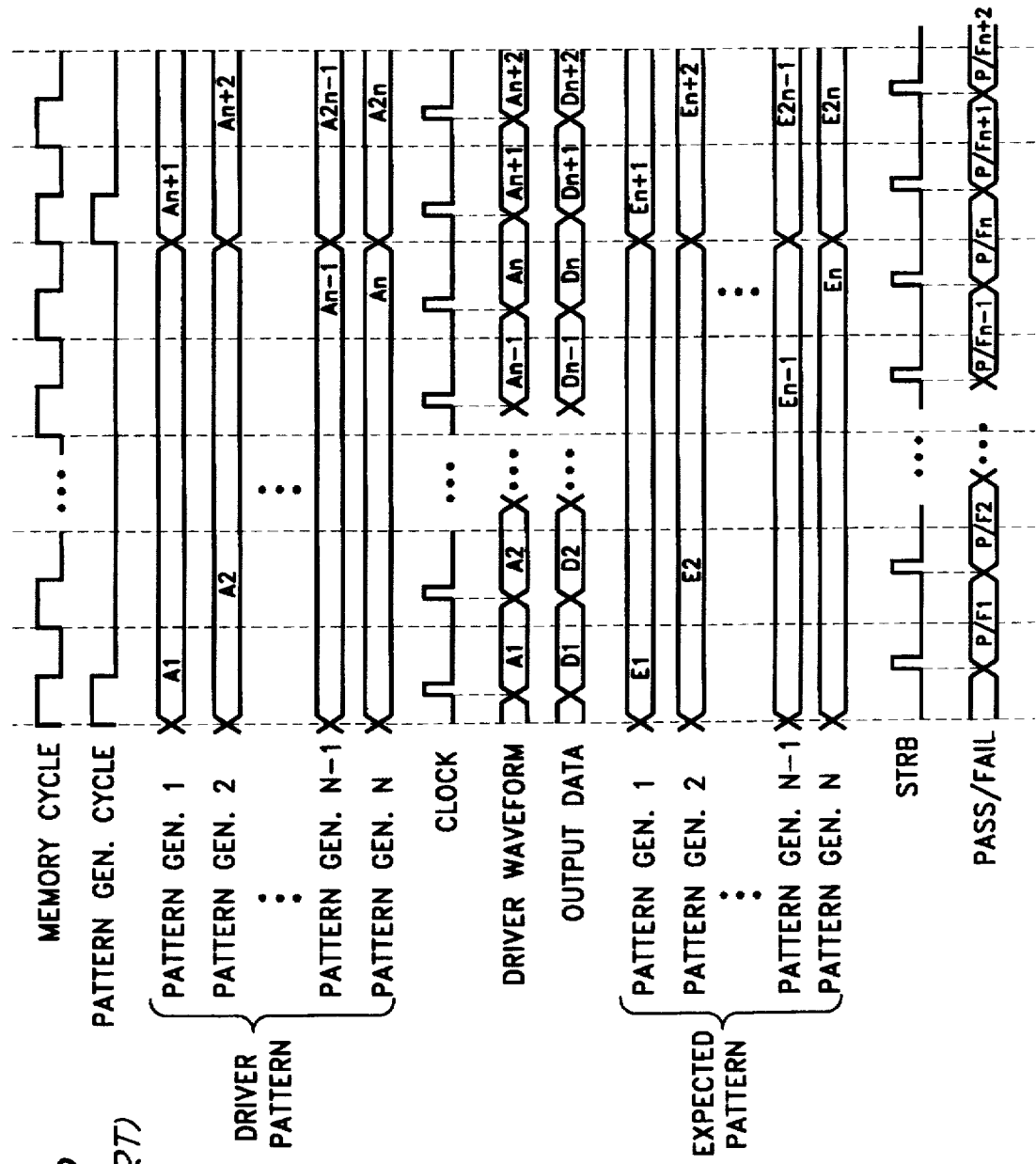
FIG. 12 is an operation timing diagram when there is no latency operation using conventional multiple pattern generators.
Figure 13:
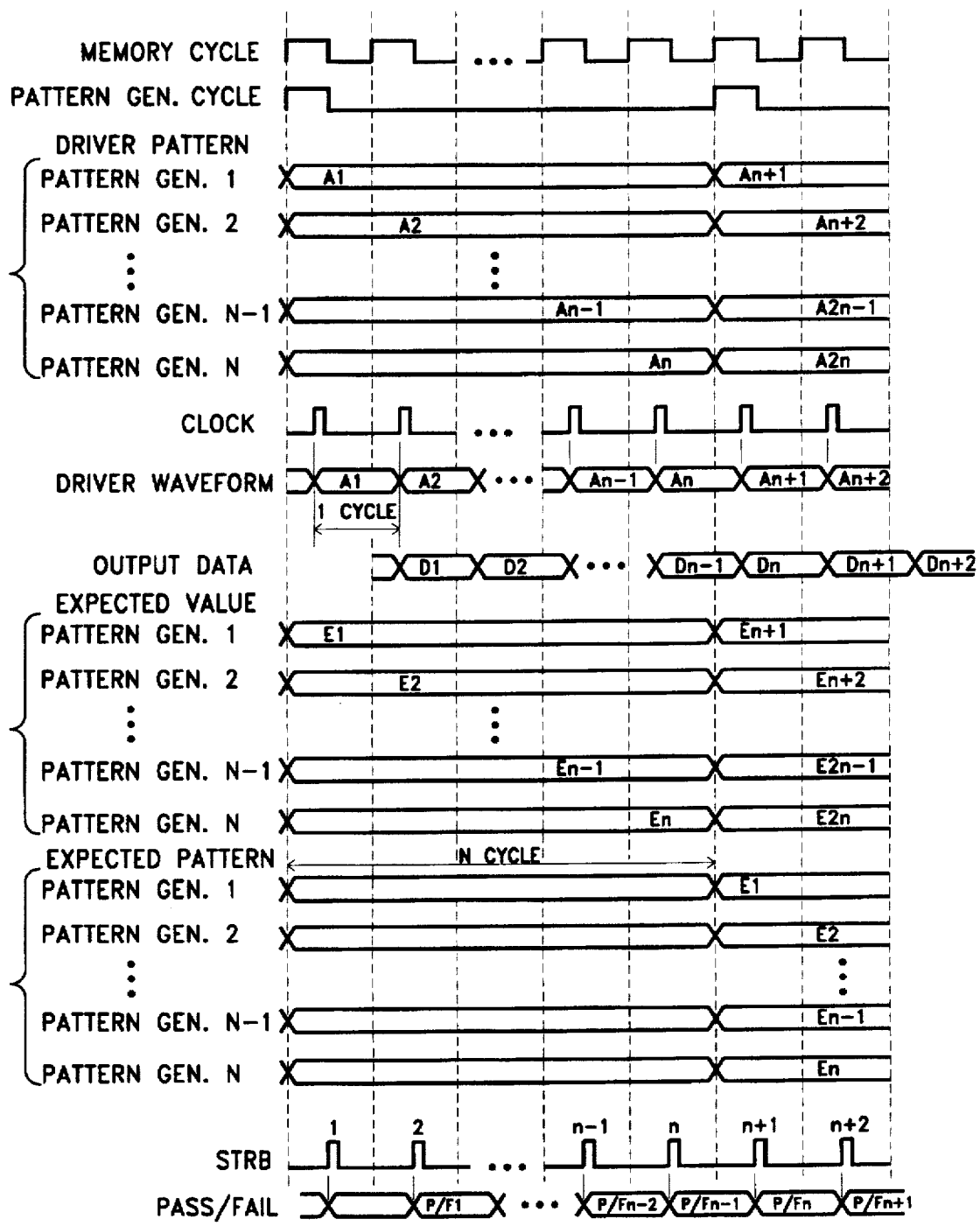
FIG. 13 is a timing diagram when there is a cycle shift using conventional multiple pattern generators.

FIGS. 7 and 8 illustrate timing diagrams for the cycle delay of 5 when testing using 4 pattern generators 20.

In this case, the driver patterns generated by each pattern generator 20 are put through the waveform shaper 212 and applied to the memory 10 as the driver waveform. In addition, under the latency operation, the output data is generated with a cycle delay of D. In this case, it is generated with a delay of 5 cycles.

On the other hand, the expected value pattern performs D+N operations, and the expected value signal is output from the pattern generator 20 after being shifted in the cycle shift section 21 by the divided value d. The output expected value shift signals are shifted in synchronizing with the RATE signal output from the period generator 231 and output as the expected value signal by the phase converter 232. In this case, as D=5, N=4, d=1, there is a shift on the expected value shift signal and the expected value shift signal is delayed by the operating period one cycle of the pattern generator. Thereafter, it is shifted in synchronizing with the RATE signal and output as the expected value pattern signal.

The STRB signals from each timing generator 211, which are applied to the logical comparator 213, are generated with a delay of exTM when the residual of the previous operation D+N is e and the period of the memory 10 is TM. In this case, as D=5, N=4, and e=1, the STRB signal is generated with a delay of every TM 1 cycle.

By this operation, the output data and each STRB signal exist at the same timing in the logical comparator 213, and as each STRB signal exists within the corresponding each expected value patterns, it can determine the acceptance for each expected value pattern.

As the second embodiment by this invention is composed as explained above, is has the following effect.

That is, when testing using multiple pattern generators, it has an effect of making possible to test the device during the latency operation by cycle-shifting the expected value signal from the pattern generator and delaying the STRB signal from the timing generator for the memory device having arbitrary cycle latency operations when the operation frequency of the test system is lower than the operating frequency of the device to be tested.

We claim:

1. A semiconductor test system for testing a memory having latency cycles by adapting arbitrary cycle delays, comprising:
   a plurality of pattern generators (120) for generating test signals to be supplied to a memory (10) under test and expected value signals to be compared with outputs of said memory (10) under test by a comparator, said pattern generators operating by a first clock;
   a timing generator (11) for generating a second clock whose frequency is higher than that of said first clock and is the same frequency of an operation frequency of said memory (10) under test, said second clock determining a comparison timing in said comparator;
   wherein each of said pattern generators comprising:
      a pattern generation circuit (22) that outputs a driver pattern and an expected value signal;
      a fixed cycle shift circuit (124) that outputs a delayed expected value signal by shifting the expected value signal by one cycle period of said first clock;
      a selector (123) which is provided with said expected value signal directly from said pattern generation circuit (22) and delayed expected value signals from the other pattern generators (120) through corresponding fixed cycle shift circuits (124) to select a predetermined one of said expected value signals; and
      a cycle shift circuit (21) which provides a delay time to a selected expected value signal from said selector (123), said delay time being a function of said first clock and determined by a ratio of the number of said pattern generators (120) and latency cycles of said memory (10) under test.

2. A semiconductor test system as defined in claim 1, further includes:
   a waveform shaper (112) which is provided with at least one driver pattern output from said pattern generators (120) and supplies a wave shaped test signal to said memory (10) under test in synchronism with said second clock;
   wherein said comparator (113) compares output signals of said memory (10) under test with said expected value signals output from said plurality of said pattern generators (120) through said cycle shift circuits (21) at a timing of a strobe signal (STRB) from said timing generator (11).

* * * * *